United States Patent [19]

Bluzer

[11] Patent Number: 4,549,195
[45] Date of Patent: Oct. 22, 1985

[54] HETEROJUNCTION SEMICONDUCTOR DEVICE

[75] Inventor: Nathan Bluzer, Silver Spring, Md.

[73] Assignee: Westinghouse Electric Corp., Pittsburgh, Pa.

[21] Appl. No.: 485,091

[22] Filed: Apr. 14, 1983

[51] Int. Cl.[4] .................... H01L 27/14; H01L 29/161
[52] U.S. Cl. .......................................... 357/30; 357/4; 357/16; 357/20; 357/56
[58] Field of Search ................ 357/4, 16, 20, 30, 56

[56] References Cited

U.S. PATENT DOCUMENTS 4,137,544 1/1979 Koehler ............................. 357/30
4,260,428 4/1981 Roy ................................... 357/30

FOREIGN PATENT DOCUMENTS 2100927 6/1982 United Kingdom .

OTHER PUBLICATIONS

Vérié et al., *Appl. Phys. Lett.*, vol. 10, No. 9, May 1, 1967, pp. 241 et seq.

*Primary Examiner*—Martin H. Edlow
*Attorney, Agent, or Firm*—W. G. Sutcliff

[57] ABSTRACT

A semiconductor device is described for sensing radiant energy incorporating a pn junction formed by two layers of materials each having a different energy band gap to form a heterojunction diode and wherein the layer having the greatest energy band gap fully covers the boundaries or perimeter of the layer having a lesser energy band gap to reduce surface leakage current. Further, a semiconductor device is described for sensing radiant energy incorporating a pn junction formed by two layers of materials each having a different energy band gap to form a heterojunction diode wherein the layer having the greatest energy band gap has spaced-apart P regions to form the anode of the heterojunction diode whereby the heterojunction diode is buried below the surface of the layer having the greatest energy band gap. The invention reduces the problem of surface and bulk leakage across heterojunction diodes.

35 Claims, 5 Drawing Figures

4,549,195

HETEROJUNCTION SEMICONDUCTOR DEVICE

BACKGROUND OF THE INVENTION

1. Field of the Invention

This invention relates to semiconductor devices and more particularly to a radiant energy detector incorporating a heterojunction.

2. Description of the Prior Art

Passivation of mercury cadmium telluride surfaces and exposed junctions, particularly in materials responsive to radiant energy in the eight to twelve micrometer wavelength is a difficult problem. The technology of thick native oxide growth on mercury cadmium telluride is not available.

In U.S. Pat. No. 3,799,803, which issued in March, 1974, to H. Kraus and B. H. Breazeale, the passivation of a semiconductor surface namely mercury cadmium telluride is described by means of a hydrogen peroxide rinse to remove contaminants from the surface.

In U.S. Pat. No. 3,845,494, which issued in October 1974 to J. F. Ameurlaine and G. D. Cohen-Solal, a mercury cadmium telluride photovoltaic detector is described covered by a continuous film of material such as a metallic sulfide or selenide for preventing outward diffusion of mercurcy vapor from the detector. The film or coating which is impervious to mercury may include zinc sulfide, zinc selenide or arsenic pentaselenide.

In U.S. Pat. No. 4,132,999, which issued in January 1979 to J. H. P. Maille, a pn junction is formed in mercury cadmium telluride material by diffusing mercury through a protective layer of cadmium telluride. A mask of zinc sulfide defines the boundaries of the pn junction formed beneath the layer of cadmium telluride.

In U.S. Pat. No. 4,137,544, which issued in January 1979 to T. Koehler, a mercury cadmium telluride diode is formed by an ion implating acceptor impurities such as phosphorus, antimony or arsenic into an n-type substrate of mercury cadmium telluride. In addition, a cumulation layer is formed at the surface of the mercury cadmium telluride substrate to surround the p-type region formed by ion implantation. The ion implantation is performed right through a passivation layer such as anodic oxide. An additional mask is provided above the passivation layer to define the p-region. The resulting pn junction is formed within the mercury cadmium telluride substrate and extends to its surface which is protected by the passivation layer. The diode is particularly useful for detection of radiation in the range from 8 to 14 micrometers.

In U.S. Pat. No. 4,170,666, which issued in October 1979, to R. K. Pancholy, G. J. Kuhlmann and D. H. Phillips, the effective surface recombination velocity of III-V compound semiconductors is reduced by providing a native dielectric passivation layer on the semiconductor and by inducing a potential in the vicinity of the semiconductor-dielectric interface which repels approaching minority carriers. A layer of gallium arsenide phosphide is formed by converting the surface of gallium arsenide. Gallium arsenide phosphide has a higher energy band gap than gallium arsenide and increases the energy which minority carriers must possess in order to reach the interface of the gallium arsenide phosphide and a gallium phosphate oxide passivation dielectric as shown in FIG. 3.

It is therefore desirable to fabricate pn junctions in mercury cadmium telluride substrates with reduced surface leakage current and higher $R_oA$ products by forming the pn junction underneath a protective surface.

It is further desirable to fabricate a heterojunction photodiode which is responsive to radiant energy in the range from eight to twelve micrometers.

It is further desirable to passivate material such as mercury cadmium telluride which has a composition for an energy band gap sensitive to radiation in the range from eight to twelve micrometers by covering the exposed material with a layer of material such as mercury cadmium telluride having a composition for a greater energy band gap such as being sensitive to radiant energy in the three to five micrometer wavelength range.

It is further desirable to provide a heterojunction diode having a mesa structure wherein the edges of the pn junction of the narrowest band gap material are buried or covered by semiconductor material of the wider band gap.

It is desirable to provide a heterojunction diode having a planar structure wherein the pn heterojunction of the narrowest band gap material is buried or covered by the semiconductor material of the wider band gap.

SUMMARY OF THE INVENTION

In accordance with the present invention, an apparatus and method is described for fabricating a heterojunction semiconductor device with the pn heterojunction formed between two layers of material each having a different energy band gap wherein the edges of the pn heterojunction are buried or concealed below the surface of one of the layers to reduce leakage current across the pn heterojunction.

DESCRIPTION OF THE PREFERRED EMBODIMENT

Figure 1:
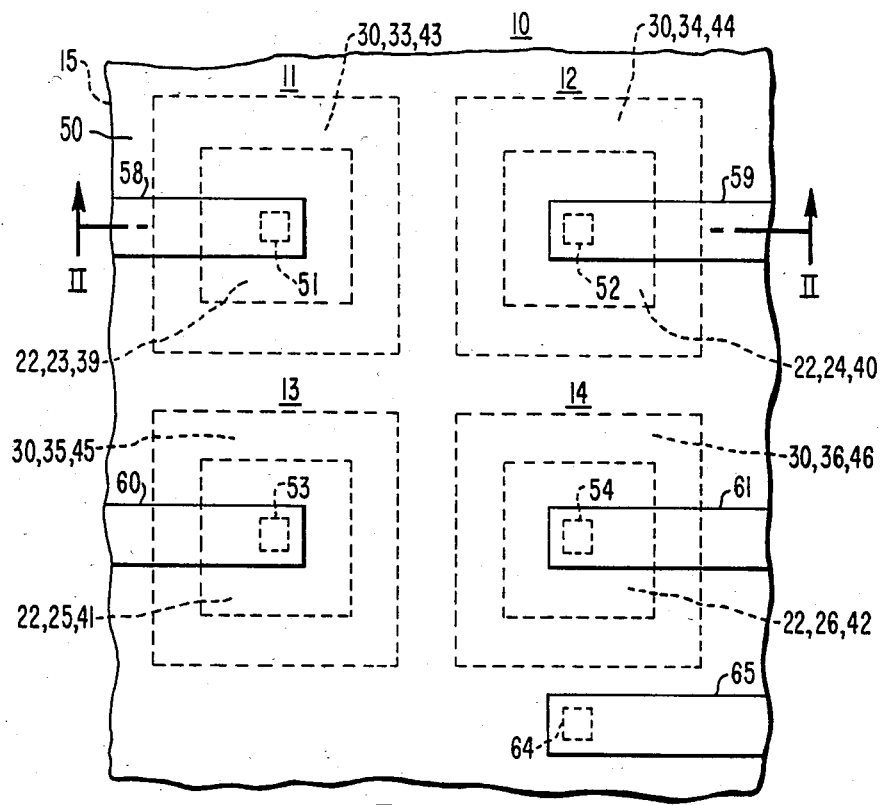
FIG. 1 is a plan view of one embodiment of the invention.
Figure 2:
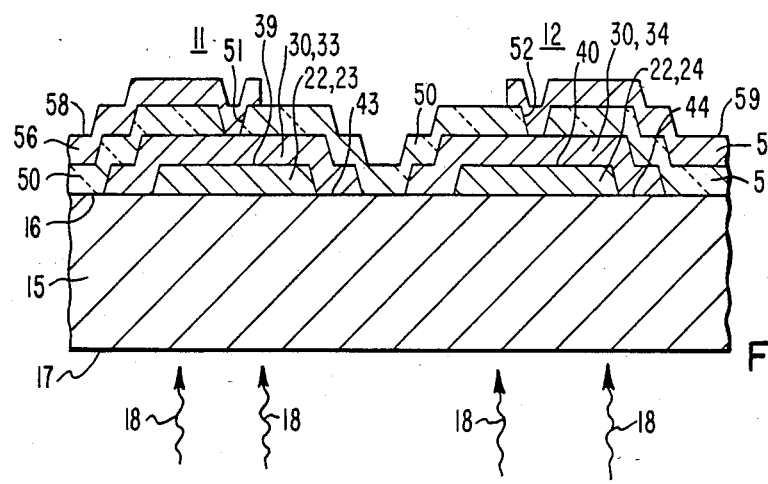
FIG. 2 is a cross-section view along the lines II—II of FIG. 1.

Referring to the drawing, and in particular, to FIG. 1, an array 10 of diodes 11 through 14 are formed on semiconductor substrate 15. FIG. 2 shows a cross-section view along lines II—II of FIG. 1. Substrate 15 may, for example, be n-type cadmium telluride having an upper surface 16 and a lower surface 17. Lower surface 17 may be adapted for receiving radiant energy 18 which may be of a wavelength suitable for passing through substrate 15. A layer 22 of semiconductor material having a predetermined energy band gap is formed on the upper surface 16 of substrate 15. Semiconductor layer 22 may, for example, be composed of mercury telluride and cadmium telluride having a ratio to form an energy band gap suitable for responding to radiant energy 18 having wavelengths in the range from eight to twelve micrometers. The intermixture of mercury telluride and cadmium telluride is generally referred to as a mercury cadmium telluride layer and may be deposited by liquid phase epitaxial (LPE) or molecular beam epitaxy (MBE). If semiconductor layer 22, composed of mercury cadmium telluride, is formed by LPE, the layer will likely be p-type after its formation. Semiconductor layer 22 may be annealed in a mercury (Hg) ambient at 300° C. to form n-type material.

After annealing and the conversion of layer 22 to an n-type region, mesa islands may be etched in layer 22 to form isolated regions, for example, four spaced apart regions 23 through 26 which are shown in FIG. 1 as rectangular and which form the cathode of diodes 11 through 14, respectively. Regions 23 through 26 are not limited to being square but may also be configured in other geometric shapes such as rectangular, circular, etc.

Over regions 23 through 26 and over upper surface 16 of substrate 15 is deposited a semiconductor layer 30. The energy band gap of the material of layer 30 should be greater than the energy band gap of the material of layer 22. For example, semiconductor layer 30 may be an intermixture of mercury telluride and cadmium telluride adjusted in composition or ratio to have an energy band gap equivalent to radiant energy in the range from three to five micrometers. Semiconductor layer 30 may be formed by a liquid phase epitaxy (LPE) process and initially will be p-type. Semiconductor layer 30 may be etched to remove material from semiconductor layer 30 to form four spaced apart regions 33 through 36 which form the anode of diodes 11 through 14, respectively. Semiconductor regions 33 through 36 cover and extend beyond the perimeter of regions 23 through 26, respectively. Regions 33 through 36 extend beyond respective regions 23 through 26 and cover a portion of upper surface 16 surrounding regions 23 through 26, respectively. Regions 33 through 36 form a pn junction 39 through 42 with regions 23 through 26, respectively. Regions 33 through 36 also form a pn junction with substrate 15 at upper surface 16 namely pn junctions 43 through 46. pn junctions 43 through 46 each surround regions 23 through 26, respectively.

The pn junctions 39 through 42 are heterojunctions since the material on either side of the junction has a different energy band gap. The pn junctions 43 through 46 may be heterojunction or homojunction. As can be seen in FIG. 2, pn junction 39 of the narrowest band gap material is buried below region 33 and is not exposed to any other layer except substrate 15. The structure of region 23 with region 33 thereover, for example, as shown in FIG. 2, may be likened to a mesa structure with region 33 protecting or covering the sides or edges of the mesa structured formed by region 23. By utilizing regions 33 through 36 with a larger energy band gap than regions 23 through 26, leakage currents on the surface of regions 23 through 26 and across pn junctions 39 through 42 are reduced since with a higher band gap material, thermal generation and/or diffusion currents are smaller because of the larger activation energy associated with a wider band gap material.

A layer 50 is deposited over regions 33 through 36 and upper surface 16 of substrate 15 to provide passivation. Materials suitable as a passivation layer 50 are zinc sulfide and zinc selenide which function to prevent the mercury in regions 33 through 36 from out diffusing. Low temperature silicon dioxide (silox or photox) by photochemical reaction is suitable for a protective layer. The low temperature deposition is in the range from 100° C.-150° C. The deposition is aided by a mercury lamp which permits the low temperature process.

Windows 51 through 54 are formed in passivation layer 50 to provide access to regions 33 through 36, respectively. A layer 56 of conductive material such as indium is deposited over windows or openings 51 through 54 and layer 50. Layer 56 is etched or removed in selected areas to form conductive paths 58 through 61 which form ohmic contact through windows 51 through 54, respectively, to regions 33 through 36, respectively.

Layer 50 may also have window 64 to enable conductive path 65 to be formed from conductive layer 56 to make ohmic contact with substrate 15.

Figure 3:
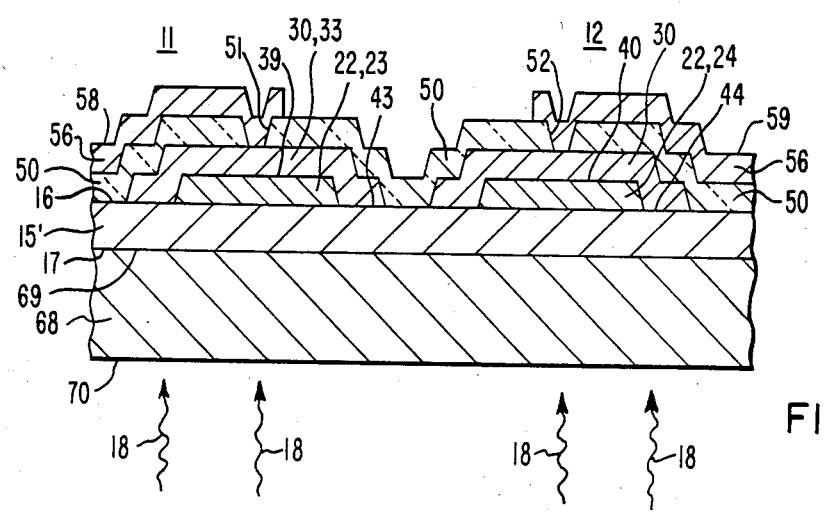
FIG. 3 is an alternate embodiment of the invention shown in cross-section view taken along the lines II—II of FIG. 1.

FIG. 3 shows a cross-section view along the II—II of FIG. 1 of an alternate embodiment of the invention. In FIG. 3, like references are used for functions corresponding to the apparatus of FIGS. 1 and 2. In FIG. 3, layer 15' has an upper surface 16 and a lower surface 17 and is of n-type semiconductor material such as cadmium telluride. Semiconductor layer 15' is deposited by MBE or LPE over substrate 68 which has an upper surface 69 and lower surface 70. Substrate 68 may, for example, be composed of a composition of mercury telluride and cadmium telluride adjusted in composition to have an energy band gap in the three to five micrometer range and to be n-type semiconductor material. Substrate 68 functions as an optical spectral filter and a support for layer 15'. Lower surface 70 of substrate 68 is suitably prepared, for example, polished and anti-reflection (AR) coated to receive radiant energy 18 which may have a wavelength in the eight to twelve micrometer range. FIG. 3 differs from FIG. 2 in that substrate 15 in FIG. 2 is replaced by semiconductor layer 15' and substrate 68. Otherwise, diodes 11 through 14 are fabricated in the same way and have the same structure.

Figure 4:
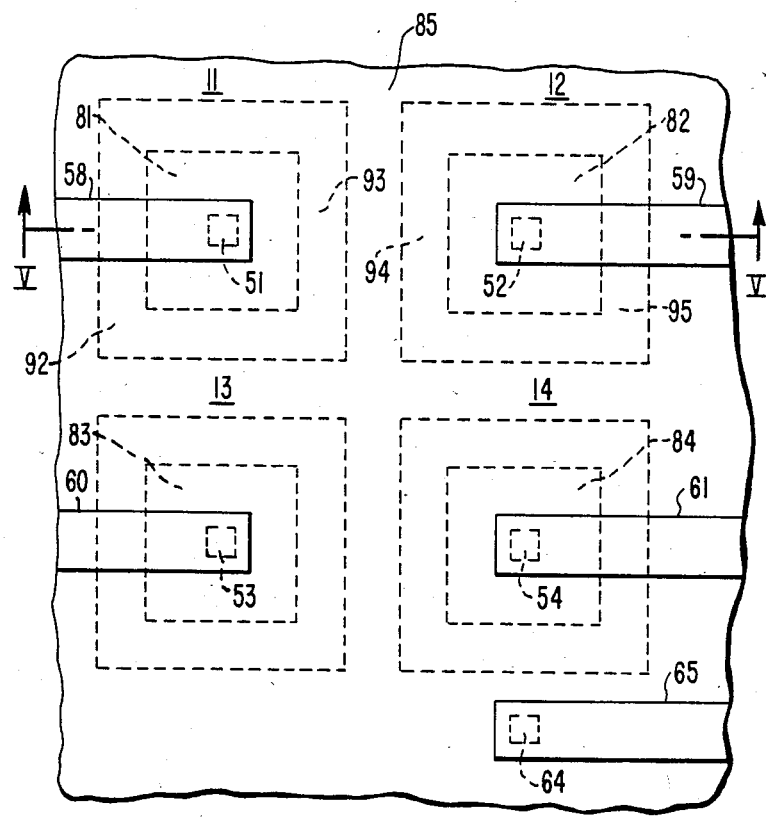
FIG. 4 is a second alternate embodiment of the invention.
Figure 5:
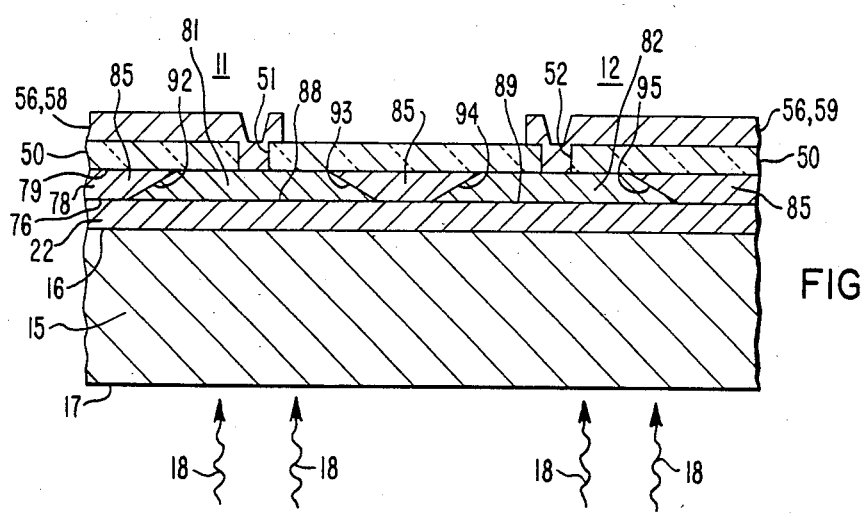
FIG. 5 is a cross section view along the lines VV of FIG. 4.

FIG. 4 shows a plan view of an alternate embodiment of the invention. FIG. 5 is a cross section view along the lines V—V of FIG. 4. In FIGS. 4 and 5 like references are used for functions corresponding to FIGS. 1 and 2. Substrate 15 may, for example, be cadmium telluride of n conductivity type.

An alternate embodiment of FIG. 4 would be to substitute layer 15' and substrate 68 shown in FIG. 3 in place of substrate 15 of the embodiment in FIG. 4. Layer 15' and substrate 68 are described in the specification and shown in FIG. 3. Layer 15' and substrate 66 would support layer 22 shown in FIG. 5 in place of substrate 15.

Semiconductor layer 22 may, for example, be mercury cadmium telluride of n conductivity type having an energy band gap in the range from 8 to 12 micrometers. Semiconductor layer 22 may have an upper surface 76. Semiconductor layer 78 which may be, for example, mercury cadmium telluride of P-conductivity type having a composition to have an energy band gap in the range from 3 to 5 micrometers is deposited over the upper surface 76 of semiconductor layer 22. Semiconductor layer 78 has an upper surface 79. Spaced apart P regions 81 through 84 are formed in semiconductor layer 78 which may be formed by converting the remaining region of semiconductor layer 78 to an n type region. If semiconductor layer 78, is composed of mercury cadmium telluride which may be formed by LPE, the layer may be annealed in a mercury (Hg) ambient at 300° C. to form n type material. A mask not shown may be deposited over upper surface 79 to prevent P-type regions 81 through 84 from being converted to n type. n type region 85 is in ohmic contact with upper surface 76 of semiconductor layer 22 which is also n type.

A layer 50 may be deposited over upper surface 79 of semiconductor layer 78 to provide passivation. Layer 50 may be, for example, zinc sulfide or zinc selenide which functions to prevent the mercury in regions 81 through 85 from out defusing. Windows 51 through 54 are formed in passivation layer 50 to provide access to regions 81 through 84, respectively. A layer 56 of conductive material such as indium is deposited over windows or openings 51 through 54 in layer 50. Layer 56 may be etched or removed in selected areas to form conductive paths 58 through 61 which form ohmic contact through windows 51 through 54, respectively, to regions 81 through 84, respectively. Layer 50 may also have window 64 to enable conductive paths 65 to be formed from conductive layer 56 to make ohmic contact with region 85 of n conductivity type which is in ohmic contact with the semiconductor layer 22 and substrate 15.

In operation radiant energy 18 passes through substrate 15 and into semiconductor layer 22 where it is absorbed and collected by regions 81 through 84. The charge collected by regions 81 through 84 is held on regions 81 through 84 by reducing bulk and surface leakage currents. PN junctions 88 and 89 extend along upper surface 79 of semiconductor layer 22 where P regions 81 through 84 are in contact with upper surface 76. PN junctions 88 and 89 are heterojunctions having materials of different energy band gaps for the anode and cathode. PN junctions 92 through 95 are formed along the side walls of regions 81 through 84 formed at the junction of region 85 with regions 81 through 84 within semiconductor layer 78. PN junctions 92 through 95 are homojunctions having an energy band gap of the material of semiconductor layer 78, which may be, for example, 3 to 5 micrometers. The intersection of pn junctions 92 through 95 with passivation layer 50 provides a surface where some leakage current may occur. It is noted, however, that the energy band gap of the semiconductor layer 78 is larger or wider than the band gap material of semiconductor layer 22. The wider band gap material tends to reduce the value of the surface leakage current.

PN junctions 88 and 89 as shown in FIG. 5 are buried below upper surface 79 and therefore contribute no surface leakage current. PN junctions 92 through 95 have an exposed junction with passivation layer 50 and therefore may have some surface leakage which is, however, minimized since the energy band gap of layer 78 is wider or greater than the energy band gap of semiconductor layer 22. It is noted that radiant energy 18 may have energy in a predetermined wavelength range to match the energy band gap of semiconductor layer 22.

A long wave infrared detector or photodiode is described wherein a semiconductor layer forming the cathode of a pn-junction has an energy band gap in the eight to twelve micrometer range and wherein its surfaces and junction are below any exposed surfaces by being covered with semiconductor material having a greater energy band gap forming the anode. The protective layer of semiconductor material is of greater energy band gap such as in the three to five micrometer range which reduces surface leakage current associated with the semiconductor layer having an energy band gap in the eight to twelve micrometer range and provides a higher $R_oA$ product. Interfacing of the HgCdTe detectors with charge coupled devices (CCD)'s requires detectors with higher $R_oA$ products. $R_o$ is the ohmic resistance through the pn junction with zero volts or bias across the junction. Area A is the area of the pn junction. Higher $R_oA$ products normally indicate lower surface leakage current which appears as a shunting resistance to the bulk resistance of the pn junction.

I claim:

1. A semiconductor device comprising a semiconductor substrate having an upper surface, a first layer of n-type semiconductor material having a first composition and a first energy band gap, said first layer supported by said substrate and terminating interior of the edge of said upper surface of said substrate, a second layer of p-type semiconductor material having a second composition and a second energy band gap, said second layer covering said first layer and extending beyond the perimeter of said first layer and onto said substrate, a layer of passivation over said second layer, first means for making electrical contact to said first layer and second means for making electrical contact to said second layer.

2. The semiconductor device of claim 1 wherein said first energy band gap has a value less than said second energy band gap.

3. The semiconductor device of claim 1 wherein said semiconductor substrate includes cadmium telluride of n-type.

4. A semiconductor device of claim 1 wherein said first composition includes an intermixture of mercury telluride and cadmium telluride.

5. The semiconductor device of claim 4 wherein the ratio of mercury telluride to cadmium telluride forms an energy band gap in the range from eight to twelve micrometers.

6. The semiconductor device of claim 1 wherein said second composition includes an intermixture of mercury telluride and cadmium telluride.

7. The semiconductor device of claim 6 wherein said ratio of mercury telluride to cadmium telluride is adjusted to provide an energy band gap in the range of three to five micrometers.

8. The semiconductor device of claim 1 wherein said layer of passivation includes zinc sulfide.

9. The semiconductor device of claim 1 wherein said second means of making electrical contact includes indium metallization passing through an opening in said layer of passivation.

10. The semiconductor device of claim 1 wherein said substrate includes n-type mercury cadmium telluride having an energy band gap in the three to five micrometer range with a layer of cadmium telluride of n-type thereover.

11. A semiconductor device for sensing radiant energy comprising:
a heterojunction diode formed by first and second layers of semiconductor material each having a different energy band gap,
a substrate for supporting said first layer,
said second layer having the greatest energy band gap and fully covering said first layer and the perimeter of said first layer and a portion of said substrate to reduce surface leakage current.

12. The semiconductor device of claim 15 wherein said substrate is of semiconductor material including cadmium telluride of n-type.

13. The semiconductor device of claim 15 wherein said first layer includes an intermixture of mercury telluride and cadmium telluride.

14. The semiconductor device of claim 17 wherein the ratio of mercury telluride to cadmium telluride forms an energy band gap within the eight to twelve micrometer range.

15. The semiconductor device of claim 15 wherein said second layer includes an intermixture of mercury telluride and cadmium telluride.

16. The semiconductor device of claim 19 wherein the ratio of mercury telluride to cadmium telluride is adjusted to provide an energy band gap in the range of three to five micrometers.

17. The semiconductor device of claim 15 further including a layer of passivation including zinc sulfide over and said second layer.

18. The semiconductor device of claim 15 wherein said substrate includes n-type mercury cadmium telluride having an energy band gap in the three to five micrometer range and including a layer of cadmium telluride of n-type over said n-type mercury cadmium telluride.

19. The semiconductor device of claim 15 wherein said layer of passivation includes silicon dioxide deposited by a low temperature process in the temperature range from 100° C. to 150° C.

20. A semiconductor device comprising a semiconductor substrate having an upper surface, a first layer of N-type semiconductor material having a first composition and a first energy band gap, said first layer supported by said substrate, a second layer of semiconductor material having a second composition and a second energy band gap, said second layer having spaced-apart P regions in contact with said first layer to form pn heterojunctions, the region between said spaced-apart P regions of said second layer being N-type conductivity material and being in ohmic contact with said first layer, a layer of passivation over said second layer, first means for making electrical contact to said first layer and second means for making electrical contact to said P regions in said second layer.

21. The semiconductor device of claim 24 wherein said first energy band gap has a value less than said second energy band gap.

22. The semiconductor device of claim 23 wherein said semiconductor substrate includes cadmium telluride of N-type.

23. A semiconductor device of claim 24 wherein said first composition includes an intermixture of mercury telluride and cadmium telluride.

24. The semiconductor device of claim 27 wherein the ratio of mercury telluride and cadmium telluride forms a first layer having a first energy band gap in the range from 8 to 12 micrometers wavelength.

25. The semiconductor device of claim 24 wherein said second composition includes an intermixture of mercury telluride and cadmium telluride.

26. The semiconductor device of claim 29 wherein the ratio of mercury telluride to cadmium telluride is adjusted to provide a second energy band gap in the range of 3 to 5 micrometers wavelength.

27. The semiconductor device of claim 24 wherein said layer of passivation includes zinc sulfide.

28. The semiconductor device of claim 24 wherein said second means for making electrical contact includes indium metallization passing through an opening in said layer of passivation.

29. A semiconductor device for sensing ultraviolet radiant energy comprising:
a heterojunction diode formed by first and second layers of semiconductor material each having a different energy band gap,
a substrate for supporting said first layer,
said second layer having the greatest energy band gap and having spaced-apart P regions in contact with said first layer with the region between said spaced apart P regions being N-type,
a layer of passivation over said second layer.

30. The semiconductor device of claim 37 wherein said substrate is of semiconductor material including cadmium telluride of N-type.

31. The semiconductor device of claim 37 wherein said first layer includes an intermixture of mercury telluride and cadmium telluride.

32. The semiconductor device of claim 39 wherein the ratio of mercury telluride and cadmium telluride forms a first layer having an energy band gap in the range from 8 to 12 micrometer wavelength.

33. The semiconductor device of claim 37 wherein said second layer includes an intermixture of mercury telluride and cadmium telluride.

34. The semiconductor device of claim 41 wherein the ratio of mercury telluride to cadmium telluride is adjusted to provide a second layer having an energy band gap in the range of 3 to 5 micrometer wavelength.

35. The semiconductor device of claim 37 wherein said layer of passivation includes zinc selenide.

* * * * *